United States Patent
Shiraishi

[11] Patent Number: 5,861,320
[45] Date of Patent: Jan. 19, 1999

[54] POSITION DETECTION MARK AND POSITION DETECTION METHOD

[75] Inventor: Naomasa Shiraishi, Kawasaki, Japan

[73] Assignee: Nikon Corporation, Tokyo, Japan

[21] Appl. No.: 613,253

[22] Filed: Mar. 8, 1996

[30] Foreign Application Priority Data

Mar. 10, 1995 [JP] Japan ................................. 7-050725

[51] Int. Cl.$^6$ ........................... H01L 21/66; H01L 21/76; G01R 31/26
[52] U.S. Cl. .............................................. 438/16; 438/401
[58] Field of Search ...................... 437/8, 924; 250/548, 250/491.1; 355/53; 356/400, 401; 438/16, 401

[56] References Cited

U.S. PATENT DOCUMENTS

| | | | |
|---|---|---|---|
| 4,780,617 | 10/1988 | Umatate et al. | 250/548 |
| 5,432,608 | 7/1995 | Komoriya et al. | 356/401 |
| 5,503,962 | 4/1996 | Caldwell | 430/317 |

FOREIGN PATENT DOCUMENTS 5-160001  6/1993  Japan .

OTHER PUBLICATIONS

Wittekoek et al., "Phase Gratings as Waferstepper Alignment Marks for All," Optical Microlithography IV, SPIE, vol.538, pp. 24–31, No Month 1985.

*Primary Examiner*—Brian Dutton
*Attorney, Agent, or Firm*—Shapiro and Shapiro

[57] ABSTRACT

An exposure substrate includes a position detection mark having a recessed or projecting portion formed on the substrate with a difference h in depth. The difference h in depth of the recessed or projecting portion is set to $$(2m+1)\lambda/4 - 0.05\lambda \leq h \leq (2m+1)\lambda/4 + 0.05\lambda$$

where $\lambda$ is the wavelength or center wavelength in a photoresist, of a monochromatic or quasimonochromatic detection beam to be irradiated on the position detection mark, and m is an integer not less than 0.

6 Claims, 11 Drawing Sheets

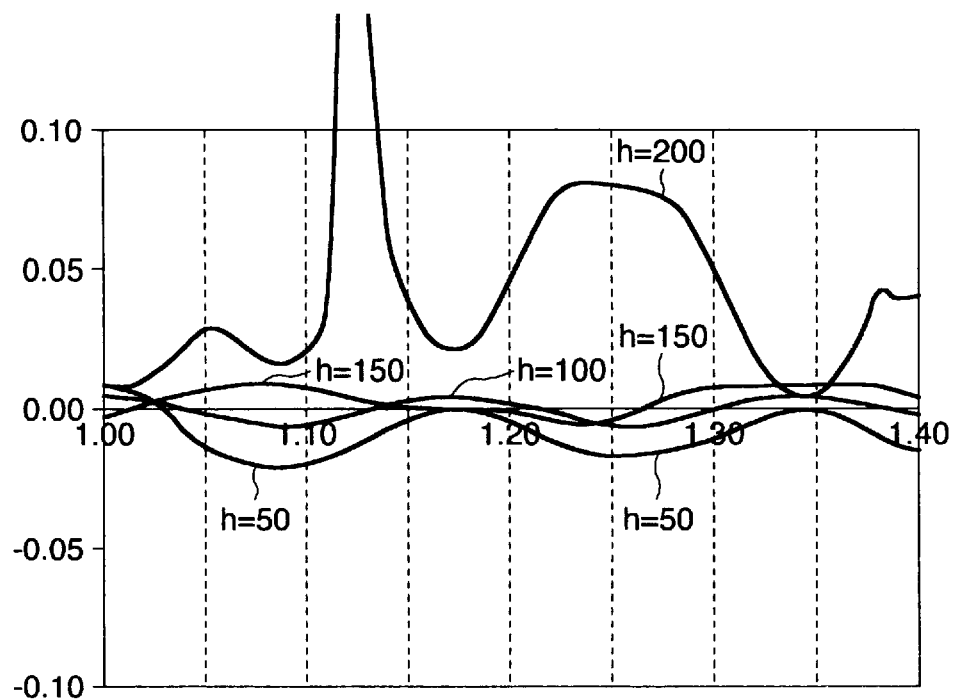
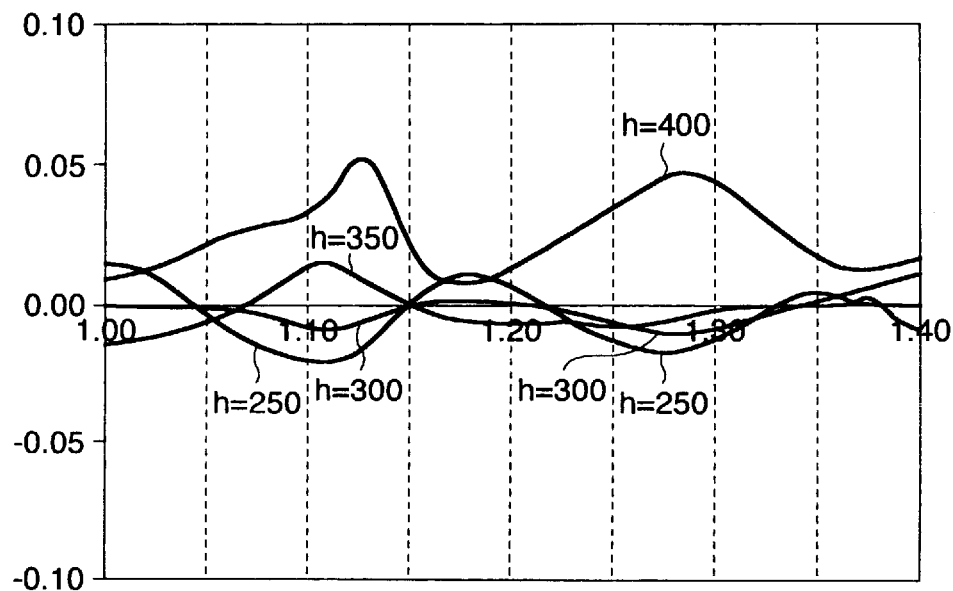

POSITION DETECTION MARK AND POSITION DETECTION METHOD

BACKGROUND OF THE INVENTION

1. Field of the Invention

The present invention relates to a mask pattern suitable for an exposure apparatus for exposing a photosensitive substrate with a mask pattern used in a photolithography step of manufacturing, e.g., semiconductor elements, and a photosensitive substrate alignment technique.

2. Related Background Art

In a photolithography step of manufacturing microdevices such as a semiconductor device, a liquid crystal display element, an image pickup element (CCD), and a thin film magnetic head, a projection exposure apparatus is used. In this apparatus, the image of a photomask or reticle (to be referred to as a "reticle" hereinafter) on which a transfer pattern is formed is projected on a photosensitive substrate (e.g., a wafer or a glass plate coated with a photoresist) through a projection optical system.

In the projection exposure apparatus of this type, the reticle and the wafer must be aligned to each other with a high precision prior to an exposure process. To perform this alignment, a position detection mark (alignment mark) is formed (transferred by exposure) on the wafer in the first photolithography step, and an accurate position of the wafer (or a circuit pattern on the wafer) can be detected by detecting the position of this alignment mark.

There are three major methods of detecting the position of a mark on a wafer. In the first method, an mark image is picked up to detect its position by image processing. The second method is a laser beam scanning scheme in which a grating-like alignment mark with a pitch in a direction perpendicular to the measurement direction is scanned relative to a sheet beam to detect the position of the mark based on a change in the intensity of a beam scattered or diffracted by this mark. The third method is called a "grating alignment" method using a grating-like alignment mark with a pitch in the measurement direction. This method is further subdivided into several methods in accordance with the arrangements of optical systems.

In the first arrangement, two laser beams are incident on an entire alignment mark from the directions of particular diffracted orders to detect the mark position based on a change in the amount of the beam diffracted by the mark. This method includes a heterodyning scheme and a homodyning scheme. In the former scheme, a slight frequency difference is generated between two laser beams to move interference fringes formed by this difference at a constant speed. In the latter scheme, an alignment mark is moved with respect to still interference fringes formed by two laser beams having no frequency difference.

In the second arrangement, one laser beam is incident on an entire alignment mark, two beams diffracted by this mark are condensed on a "reference grating" and formed into an image, and the alignment mark and the reference grating are scanned relative to each other to detect the position of the mark based on a change in the amount of a transmitted beam or a reflected beam by the reference grating.

Although a position detection optical system can also employ an off-axis scheme in which an exclusive microscope is arranged in addition to a projection optical system, a TTL (Through The Lens) scheme using a projection optical system itself as a position detection optical system is generally excellent in detection stability. Normally, a projection optical system is optimumly designed for an exposure wavelength (quasimonochromatic ultraviolet ray) and has a large chromatic aberration with respect to a position detection beam (its wavelength is normally 500 nm or more). For this reason, in the TTL scheme, the position detection beam is limited to a monochromatic beam or a quasimonochromatic beam. To the contrary, a method in which position detection optical systems are separately arranged for detection beams having a plurality of wavelengths to perform position detection with the plurality of wavelengths even in the TTL scheme, and a method in which an optical system for correcting a chromatic aberration of a projection optical system is arranged, and a detection beam with a certain wavelength width is used have been attempted.

An alignment mark formed on the surface of, e.g., a wafer to be used in the above position detection methods is generally a corrugated mark with a difference in depth. This corrugated mark is slightly asymmetric due to processes such as etching and sputtering in a photolithography step, and coating nonuniformity of a photoresist. This asymmetry decreases the position detection precision.

Of these position detection schemes, particularly in the TTL scheme, the temporal coherence length of a detection beam is large because the detection beam is a monochromatic beam or a quasimonochromatic beam whose wavelength width is not so large. Therefore, in the asymmetric corrugated mark, the asymmetry in the direction of mark height (depth) adversely affects the position detection precision.

When an exclusive microscope is used, although a chromatic aberration is not limited in the wavelength band of a detection beam, its wavelength band is substantially limited within the range of 500 nm to 1,500 nm to prevent of exposure of a photoresist on a wafer and by the transmittance of optical glass. For this reason, the temporal coherence length is 1 $\mu$m or more, which becomes 1/1.66=0.60 $\mu$m in a photoresist having a refractive index of, e.g., 1.66. As for an alignment mark whose difference in depth at a recessed or projecting portion is 0.60/2=0.30 $\mu$m (the value is divided by 2 because the detection beam is reflected to reciprocate), the asymmetry in the direction of height (depth) also adversely affects the position detection precision even with the exclusive microscope.

When a detection beam having a wide wavelength is used in the TTL scheme, the precision is increased by averaging the wavelengths in an alignment mark with a difference in depth to a certain extent. In an alignment mark with a difference in depth smaller than the coherence length, however, the precision cannot be increased unlike in the above alignment mark.

If the position detection precision is decreased due to a difference in depth at a recessed or projecting portion and coating nonuniformity of a photoresist, the alignment (overlapping) precision between a reticle and a wafer is decreased in a photolithography step of manufacturing microdevices such as a semiconductor device, and particular in an exposure step. A microdevice with predetermined characteristics cannot be attained.

SUMMARY OF THE INVENTION

The present invention has been made in consideration of the above problem, and has as one of its object to provide a position detection mark and position detection method which realizes a high position detection precision, and a method of aligning a mask and a substrate with a high precision to form a microdevice on the substrate.

In the present invention, a difference h in depth of a recessed or projecting portion is set by $$(2m+1)\lambda/4 - 0.05\lambda \leq h \leq (2m+1)\lambda/4 + 0.05\lambda$$

where $\lambda$ is the wavelength or center wavelength of a monochromatic or quasimonochromatic detection light near a position detection mark (alignment mark) consisting of the recessed or projecting portion formed on a substrate. Therefore, in all the above position detection schemes, the detection error caused by the asymmetry in the direction of height (depth) of the position detection mark can be greatly reduced. Particularly, in the use of a grating mark (phase gratings having difference in depth) as the position detection mark, the amount of a beam diffracted by the mark is maximized under the above condition of the difference in depth, thereby further increasing the position detection precision.

This position detection mark is formed on the surface of a substrate or a film (layer) formed on the substrate. Particularly when the substrate is a semiconductor wafer, the position detection mark is desirably formed on the surface in the most initial step of processing the semiconductor wafer. Further, the position detection mark can desirably have an arrangement in which a plurality of recessed or projecting portions are aligned at a pitch in the measurement direction, an arrangement in which a plurality of projecting or recessed portions are aligned at a pitch in a direction almost perpendicular to the measurement direction, or an arrangement with a band-like projecting or recessed portion.

In addition, the image of the position detection mark may be picked up to detect the position or positional shift of the mark based on the image. The position or positional shift of the position detection mark may be detected based on a change in the amount of the beam scattered by the mark with relative scanning of the position detection mark and the detection beam. If the position detection mark is a grating, the mark and the detection beam (sheet beam or a pair of coherent beams) may be relatively scanned to detect the position or positional shift of the mark based on a change in the amount of the beam diffracted by the mark, or a pair of coherent beams having different frequencies are symmetrically incident on the position detection mark to detect the position or positional shift of the mark based on the phase of the photoelectrically converted signal of the beam diffracted by the mark. Still further, a coherent beam is irradiated on the position detection mark, at least two beams diffracted by the mark are formed into an image on a reference grating arranged at a position conjugated to the position detection mark, and the position detection mark and the reference grating are relatively scanned to detect the position or positional shift of the mark based on a change in the amount of the beam transmitted through or reflected by the reference grating.

Moreover, in the present invention, an alignment mark consisting of a recessed or projecting portion is formed on a substrate on which microdevices such as a semiconductor element, a liquid crystal display element, an image pickup element (CCD), and a thin film magnetic head are formed. At this time, the difference h in depth of the recessed or projecting portion is set to $$(2m+1)\lambda/4 - 0.05\lambda \leq h \leq (2m+1)\lambda/4 + 0.05\lambda$$

where $\lambda$ is the wavelength or center wavelength of a monochromatic or quasimonochromatic detection light near the alignment mark. The detection beam is irradiated on the alignment mark formed on the substrate covered with a photoresist to detect the position or positional shift of the mask. The substrate and the mask are relatively moved in accordance with the detection result to expose the photoresist formed on the substrate with the pattern image of the mask.

When the position detection mark is exposed in outer air (or vacuum), $\lambda$ in the above condition represents the wavelength of the detection beam in outer air (or vacuum). That is, the difference h in depth is set within $(2m+1)/4$ times$\pm 0.05\lambda$ the wavelength $\lambda$ of the detection light in outer air (or vacuum). When the position detection mark is covered with a thin film, such as a photoresist, having a refractive index n, $\lambda$ in the above condition represents the wavelength of the detection light in the thin film. That is, the difference h in depth is set within $(2m+1)/4n$ times$\pm 0.05\lambda$ the wavelength $\lambda$ of the detection light in the photoresist (in other words, in outer air vacuum). Note that, when the position detection mark is covered with a plurality of thin films, the difference h in depth is set within $(2m+1)/4$ times$\pm 0.05\lambda$ the wavelength $\lambda$ of the detection light in a thin film nearest the mark. That is, in the present invention, the wavelength $\lambda$ in the above condition of the difference in depth is the wavelength or the center wavelength of the detection light in a medium (thin film, fluid, vacuum, or the like) brought into contact with the position detection mark.

Note that, in the present invention, the condition of the difference in depth is examined in terms of a reduction in detection error caused by the asymmetry of the position detection mark in the direction of height (depth). The amount of a diffracted beam is maximized in the phase gratings having difference in depth under the above condition of the difference in depth to greatly reduce the influence of the asymmetry of the position detection mark in the direction of height (depth) on the position detection error.

BRIEF DESCRIPTION OF THE DRAWINGS

FIGS. 7A to 7E are views, respectively, showing the arrangements of a grating-like mark with a difference in depth and a band-like mark with a difference in depth used in the second embodiment, in which FIG. 7A is a plan view showing a position detection mark using the grating-like mark with a difference in depth, FIG. 7B is a sectional view taken along the line 7B—7B in FIG. 7A, FIG. 7C is a sectional view taken along the line 7C—7C in FIG. 7A, FIG. 7D is a plan view showing the band-like mark with a difference in depth, and FIG. 7E is a sectional view taken along the lien 7E—7E in FIG. 7D;

FIGS. 9A and 9B are graphs, respectively, showing the simulation results of the relationship between the difference in depth of a position detection mark and the position detection precision in the first embodiment;

DESCRIPTION OF THE PREFERRED EMBODIMENTS

Figure 1A:
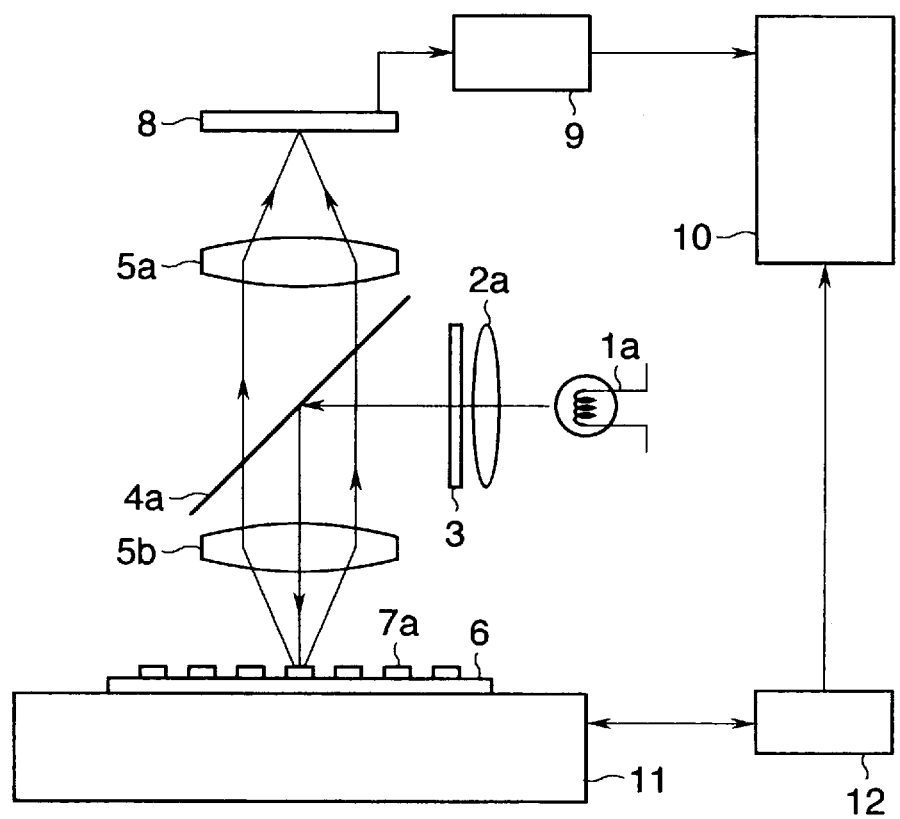
FIG. 1A is a view showing the arrangement of a position detection apparatus of an image pickup/image processing scheme according to the first embodiment.
Figure 1B:
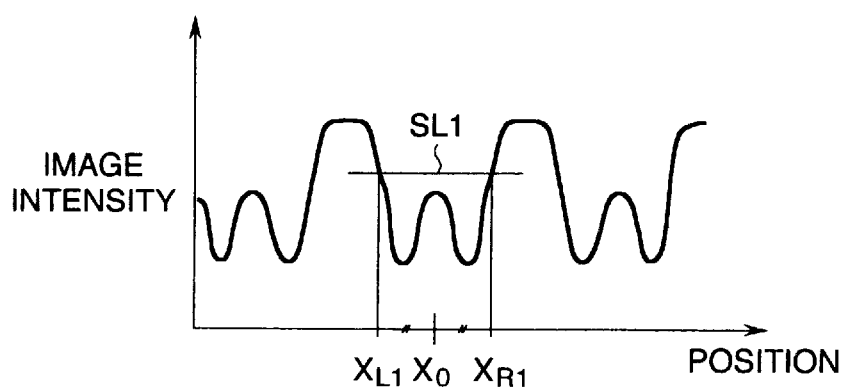
FIG. 1B is a graph for explaining the operation of the apparatus.

The first embodiment of the present invention will be described with reference to FIGS. 1A and 1B. FIG. 1A shows the schematic arrangement of a position detection apparatus of an image pickup/image processing scheme suitable for the present invention. Broad-band beams emitted from a light source 1a such as a halogen lamp are irradiated on a position detection mark 7a formed on a semiconductor wafer 6 through a condenser lens 2a, a wavelength selection filter 3, a half mirror 4a, and an objective lens 5b. The wavelength selection filter 3 passes, of the broad-band beams emitted from the light source, a beam in a wavelength band of 550 to 750 nm (center wavelength: 650 nm). An objective lens 5a and the objective lens 5b correct a chromatic aberration in this wavelength band with a high precision.

Figure 6A:
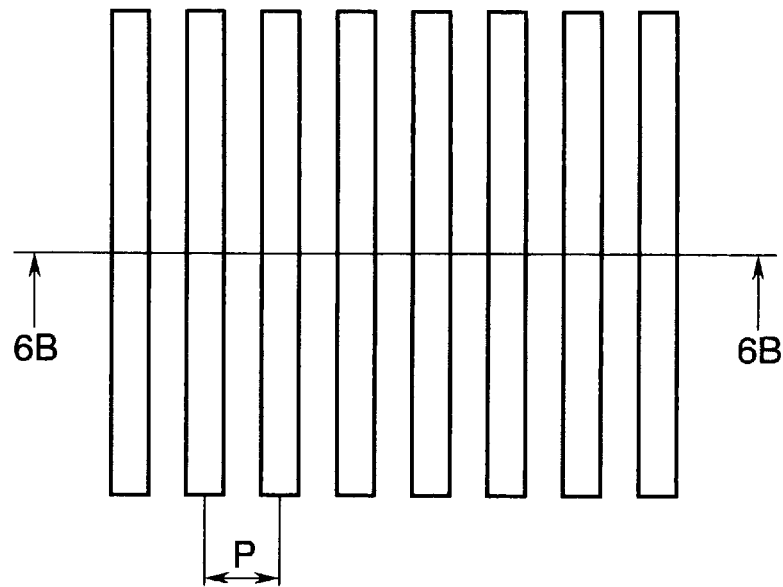
FIG. 6A is a view showing the arrangement of a grating-like mark with a difference in depth used in the first embodiment.
Figure 6B:
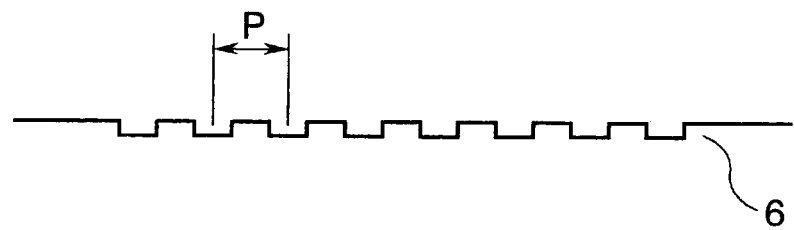
FIG. 6B is a sectional view taken along the line 6B—6B in FIG. 6A.

The position detection mark (alignment mark) 7a is a one-dimensional grating-like mark with a difference in depth (corrugated mark), as shown in FIGS. 6A and 6B, and has a pitch P in the measurement direction (in the right-and-left direction on the drawings). FIG. 6A is a plan view showing the position detection mark 7a, and FIG. 6B is a sectional view taken along the line 6B—6B in FIG. 6A when viewed from the direction indicated by arrows. In this embodiment, a plurality of linear recessed portions (or projecting portions) are directly formed on the surface of the semiconductor wafer 6 at the pitch P.

The beam reflected by the position detection mark 7a is condensed through the objective lens 5b, the half mirror 4a, and the lens 5a to form the image of the position detection mark 7a on an image pickup element 8 such as a CCD. In this image, bright and dark portions repeatedly appear in accordance with the pitch P of the position detection mark 7a, as shown in FIG. 1B. An image processing apparatus 9 processes the image to detect, e.g., n pairs of slice positions $x_{Ln}$ and $x_{Rn}$ of the image intensities at specific slice levels. The image processing apparatus 9 then calculates the average value (i.e., the average value of 2n slice positions) of these positions. In FIG. 1B, a detected position $x_0$ of the position detection mark 7a is simply represented by the average value of a pair of slice positions $x_{L1}$ and $x_{R1}$ of the image intensity at slice level SL1.

At this time, a laser interferometer 12 measures the position of a wafer stage 11. A main control system 10 accurately detects the position (position on the coordinate system defined by the interferometer 12) of the position detection mark 7a based on the stage position obtained by the interferometer 12 and the detection position of the position detection mark 7a by the image processing apparatus 9.

Figure 8:
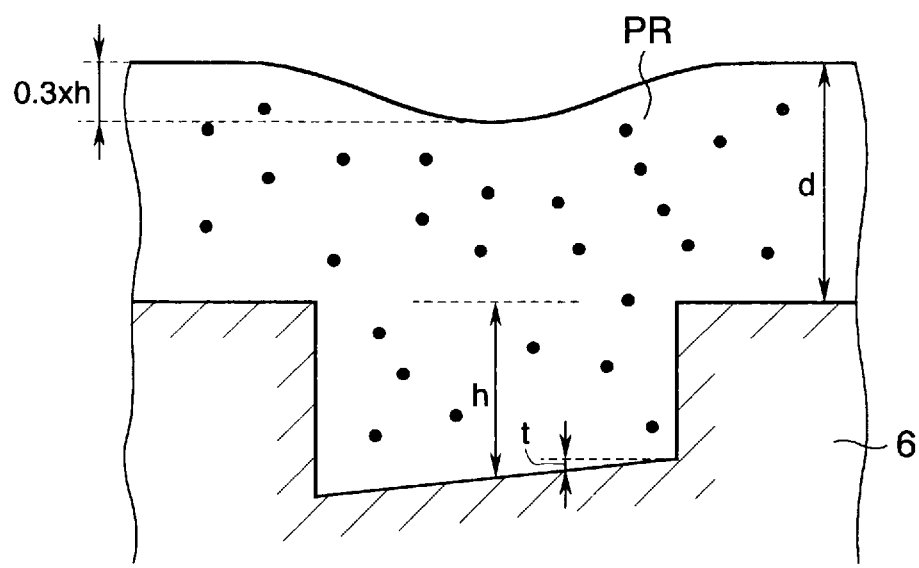
FIG. 8 is a partial enlarged sectional view of a position detection mark covered with a photoresist.

FIGS. 9A and 9B show the simulation results of the relationship between a difference h in depth of the position detection mark 7a and the position detection precision in the apparatus shown in FIG. 1A. The shape of a position detection mark used for the simulation is a grating in which each of projecting and recessed portions has a width of 6 $\mu$m in the pitch direction, and the pitch P=12 $\mu$m. FIG. 8 is an enlarged sectional view showing a portion, corresponding to one pitch, of the position detection mark 7a in FIG. 6B. In this simulation, the difference h in depth of the position detection mark 7a, and a thickness d of a photoresist PR were set as parameters, and each recessed portion of the position detection mark 7a was tapered at a tilt t=0.2% in the pitch direction (measurement direction). At the recessed portion, the surface of the photoresist PR was recessed by 0.3×h, and the shape of the resist surface was expressed by a sine function (pitch P). A refractive index n of the semiconductor wafer 6 was set at 3.5, and the refractive index n of the photoresist PR was at 1.66. The wavelength band of an illumination beam (detection beam) was set at 550 to 750 nm (center wavelength: 650 nm), the numerical aperture of the imaging system (objective lens 5a) was at 0.2, and the slice level in the image processing apparatus 9 was at a middle value (average value) between the maximum and minimum values of the image intensity.

In FIGS. 9A and 9B, the resist thickness d [$\mu$m] is plotted along the abscissa, and a position detection error [$\mu$m] is plotted along the ordinate. FIG. 9A shows the simulation result with the differences h in depth of 50, 100, 150, and 200 nm, while FIG. 9B shows the simulation result with the differences h in depth of 250, 300, 350, and 400 nm.

In FIGS. 9A and 9B, the detection error varies in accordance with a change in resist thickness d. With the differences h in depth of 100 nm and 300 nm, the variation is small, and the absolute precision is high. In this embodiment, a center wavelength $\lambda$ of a detection beam is 392 nm near the position detection mark 7a (i.e., in the photoresist) because the center wavelength of the detection beam is 650 nm, and the refractive index of the photoresist PR is 1.66. In FIGS. 9A and 9B, therefore, the differences in depth of 100 nm and 300 nm almost correspond to ¼ and ¾ the center wavelength, respectively.

From this result, in this embodiment, the position detection mark 7a consisting of recessed or projecting portions each having the difference h in depth (2m+1)/4 times the center wavelength (392 nm) of the detection beam in the photoresist PR is formed on the surface of, e.g., the semiconductor wafer 6. The broad-band detection beam is irradiated on the position detection mark 7a through the photoresist PR. The image processing apparatus 9 receives an image signal from the image pickup element 8 to obtain the detected position of the position detection mark 7a. The main control system 10 detects the position of the position detection mark 7a based on this detected position and the stage position obtained by the laser interferometer 12.

Position detection marks are normally, respectively attached to a plurality of small regions (photoresists), to which the pattern images of reticles are to be transferred, on the semiconductor wafer 6. The main control system 10 employs, e.g., a dye-by-dye alignment (D/D) scheme to detect the position of the position detection mark for every small region on the semiconductor wafer 6, and to relatively move the pattern image of a reticle and the semiconductor wafer 6 in accordance with the detected position. The small region is then exposed with the pattern image. The main control system 10 may employ, e.g., the enhanced global alignment (EGA) scheme disclosed in U.S. Pat. No. 4,780,617 to expose a pattern image. More specifically, the main control system 10 employing the EGA scheme detects the positions of position detection marks on at least three small regions on the semiconductor wafer 6, statically processes (method of least squares) the detected positions to calculate the positions of the small regions on the semiconductor wafer 6. The main control system 10 relatively moves the pattern images of reticles and the semiconductor wafer 6 in accordance with the calculated positions to expose the small regions with the pattern images.

By these methods, the patterns in the small regions on the semiconductor wafer 6 accurately overlap the pattern images of the reticles. The semiconductor wafer 6 is subjected to various processes (e.g., a developing process) to form microdevices such as semiconductor elements in the small regions on the semiconductor wafer 6.

In the simulation shown in FIGS. 9A and 9B, since the wavelength band of a detection beam is as wide as 550 to 750 nm, the coherence length of the detection beam is as short as about 2.1 µm (in the air, while about 1.3 µm in the photoresist). For this reason, if the difference h in depth of the position detection mark 7a exceeds 500 nm (optical path difference in a reciprocating travel is 1 µm), a detection error caused by the difference h in depth hardly occurs.

In this embodiment, the broad-band detection beam can be used, as described above, on the assumption that a position detection optical system of an off-axis scheme is used in addition to an projection optical system for projecting the pattern image of a reticle on the semiconductor wafer 6. When a position detection optical system of the TTL scheme is used, the wavelength band of the detection beam is narrow (e.g., several tens nm or less) or the detection beam is a monochromatic beam because a projection optical system corrects an aberration at the exposure wavelength with a high precision. When the wavelength band of the detection beam is, e.g., about several tens nm or less, or the detection beam is a monochromatic beam, a detection error depends on the mark difference h in depth even if the difference h in depth is larger (500 nm or more). It was confirmed that a detection error was very small even with a narrow wavelength band of the detection beam as far as the mark difference h in depth was about (2m+1)/4 times the wavelength or center wavelength (in the photoresist) of the detection beam.

Even in the position detection optical system of the TTL scheme, therefore, a detection error can be greatly reduced regardless of a difference in depth size by using the position detection mark whose difference h in depth is (2m+1)/4 times the wavelength or center wavelength of the detection beam. The alignment (overlay) precision between the pattern images of reticles and small regions on the semiconductor wafer 6 can be increased.

Note that, in the above simulation, although the slice positions at slice level were measured in detecting a mark position based on the mark image, the same result was obtained with a scheme using a correlation or autocorrelation with, e.g., a specific template.

Figure 2A:
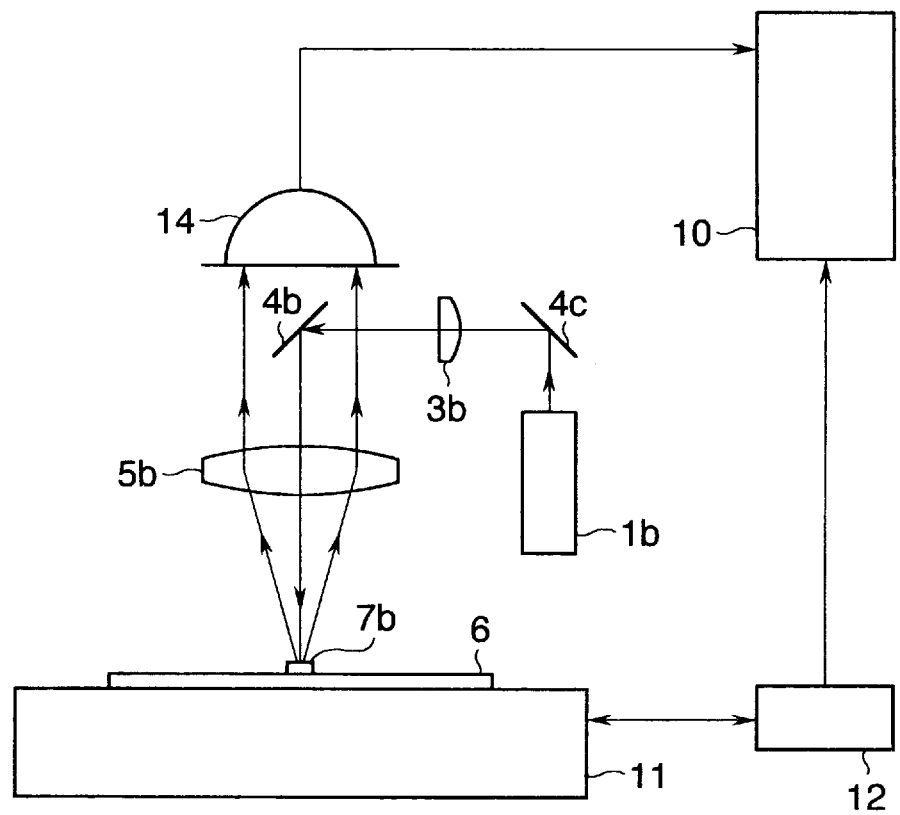
FIG. 2A is a view showing the arrangement of a position detection apparatus of a laser beam scanning scheme according to the second embodiment.
Figure 2B:
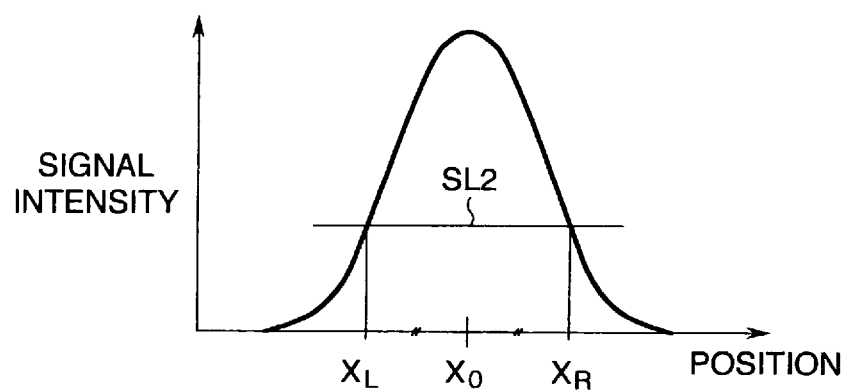
FIG. 2B is a graph for explaining the operation of the apparatus.
Figure 7A:
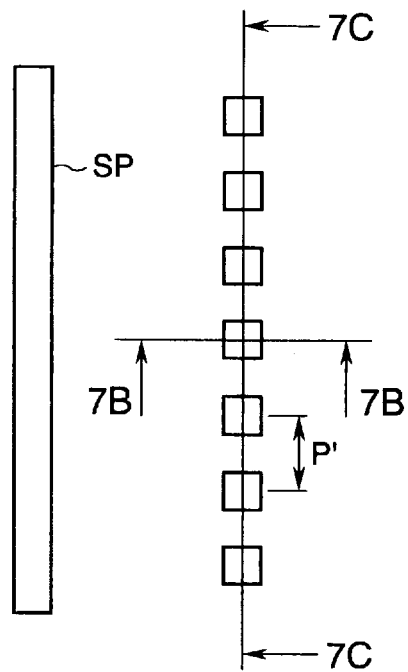
Figure 7B:
Figure 7C:
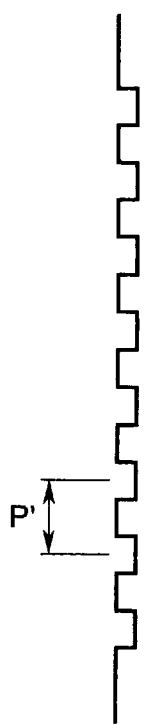

Next, the second embodiment of the present invention will be described with reference to FIGS. 2A and 2B. FIG. 2A shows the schematic arrangement of a position detection apparatus of a laser beam scanning scheme suitable for the present invention. An illumination beam (e.g., an He-Ne laser having a wavelength of 633 nm) emitted from a laser source 1b is irradiated on a position detection mark 7b formed on a semiconductor wafer 6 through a mirror 4c, a cylindrical lens 3b, a mirror 4b, and an objective lens 5b. As shown in FIGS. 7A to 7C, the position detection mark 7b is constituted by rectangularly recessed portions (or projecting portions) which are aligned at a pitch P' in a direction perpendicular to the measurement direction (in the right-and-left direction in FIG. 2A). FIG. 7A is a plan view showing the position detection mark 7b, FIG. 7B is a sectional view taken along the line 7B—7B in FIG. 7A when viewed from the direction indicated by arrows, and FIG. 7C is a sectional view taken along the line 7C—7C in FIG. 7A when viewed from the direction indicated by arrows. In this embodiment, the rectangular (square or oblong) recessed portions (or projecting portions) are directly formed in the surface of the semiconductor wafer 6 at the pitch P'.

Owing to the function of the cylindrical lens 3b, an illumination beam (laser beam) emitted from the laser source 1b has a long sheet-like shape extending substantially along the pitch direction of the position detection mark 7b (arrangement direction of recessed or projecting portions). That is, an elongated band-like laser beam (sheet beam) SP as shown in FIG. 7A is irradiated on the semiconductor wafer 6.

The diffracted beam from the position detection mark 7b is condensed on a photoelectric detector 14 through the objective lens 5b, and the photoelectric detector 14 outputs an electrical signal corresponding to the amount (intensity) of the diffracted beam to a main control system 10. The main control system 10 drives a wafer stage 11 with a driving system (not shown) to relatively scan the detection beam (sheet beam) SP and the position detection mark 7b in the measurement direction. The main control system 10 then detects the position (position on the coordinate system defined by an interferometer 12) of the position detection mark 7b based on the stage position obtained by the interferometer 12, and a change in the amount of the beam diffracted by the position detection mark 7b, i.e., a change in the intensity of the electrical signal (FIG. 2B) output from the photoelectric detector 14. At this time, the main control system 10 employs, e.g., an average value $x_0$ of slice positions $x_L$ and $x_R$ of a signal intensity at specific slice level SL2, as the detected position of the position detection mark 7b.

Figure 10A:
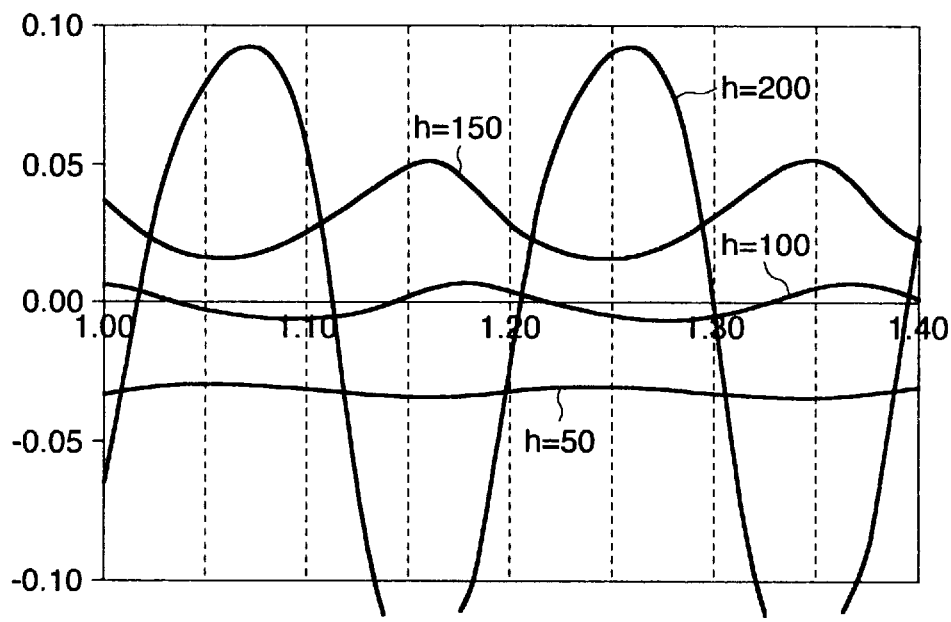
FIGS. 10A and 10B are graphs, respectively, showing the simulation results of the relationship between the difference in depth of a position detection mark and the position detection precision in the second embodiment.
Figure 10B:
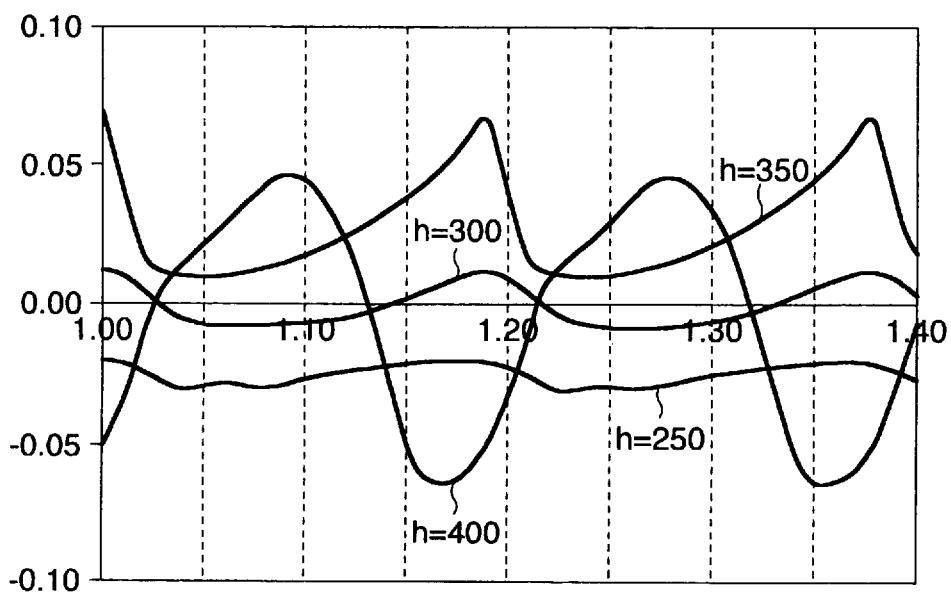

FIGS. 10A and 10B show the simulation results of the relationship between a difference h in depth of the position detection mark 7b and the position detection precision in an apparatus as shown in FIG. 2A. In the position detection mark 7b used in the simulation, 4-µm$^2$ recessed portions were aligned at the pitch P'=8 µm, and each recessed portion was tapered at a tilt t=0.1% in the measurement direction (FIG. 7B) and was not tapered in the pitch direction (FIG. 7C). At the recessed portion, the surface of a photoresist PR was recessed by 0.3×h, and the shape of the resist surface was expressed by a sine function (pitch P). In this simulation, the difference h in depth of the position detection mark 7b, and a thickness d of the photoresist PR were set as parameters. A refractive index n of the semiconductor wafer 6 was set at 3.5, and the refractive index n of the photoresist PR was at 1.66. The detection laser beam had a wavelength of 633 nm (He-Ne laser), and its shape on the semiconductor wafer 6 was 3 μm in Gaussian width in the measurement direction and infinitely long in the pitch direction.

In FIGS. 10A and 10B, the resist thickness d [μm] is plotted along the abscissa, and a position detection error [μm] is plotted along the ordinate. FIG. 10A shows the simulation result with the mark differences h in depth of 50, 100, 150, and 200 nm, while FIG. 10B shows the simulation result with the mark differences h in depth of 250, 300, 350, and 400 nm. In FIGS. 10A and 10B, as in the first embodiment (FIGS. 9A and 9B), it was found that the detection error was very small with the mark differences h in depth of 100 nm and 300 nm.

In this embodiment, since the wavelength of the detection beam was 633 nm, and the refractive index of the photoresist PR was 1.66, a wavelength λ of the detection beam near the position detection mark 7b (in the photoresist) was 381 nm. In FIGS. 10A and 10B, therefore, the differences in depth of 100 nm and 300 nm almost correspond to ¼ and ¾ the wavelength λ, respectively. More specifically, also in the position detection apparatus of the laser beam scanning scheme as in this embodiment, the detection error is very small in a position detection mark with a difference in depth corresponding to almost ¼ times or ¾ times the wavelength (381 nm) of the detection beam. Further, it was found that the detection error was very small in a position detection mark with differences in depth corresponding to ⅝ times, ⅞ times, . . . , i.e., (2m+1)/4 times (m is an integer of 0 or more) the wavelength (381 nm) of the detection beam, although not shown in FIGS. 10A and 10B.

From this result, in this embodiment, the position detection mark 7b consisting of recessed or projecting portions each having the difference h in depth (2m+1)/4 times the wavelength (381 nm) of the detection beam in the photoresist is formed on the surface of, e.g., the semiconductor wafer 6. The sheet-like detection beam is irradiated on the position detection mark 7b through the photoresist PR. The main control system 10 receives an electrical signal output from the photoelectric detector 14 with a slight movement of the wafer stage 11, and a position signal output from the interferometer 12 to detect the position of the position detection mark 7b.

Figure 7D:
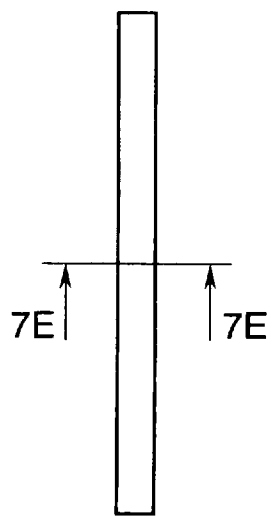
Figure 7E:

In this embodiment, the grating-like mark with a difference in depth shown in FIG. 7A is used as the position detection mark 7b, but the following mark may be employed. For example, a mark with a difference in depth which consists of a band-like (oblong) recessed or projecting portion is used, as shown in FIG. 7D, and the beam scattered by this band-like mark is received in the position detection apparatus in FIG. 2A. Also in this arrangement, it was found from a simulation similar to the above one that the detection error was smallest when the difference in depth of the band-like mark was (2m+1)/4 times the wavelength of the detection beam in the photoresist. That is, in the position detection apparatus of the laser beam scanning scheme, the detection error in detecting any one of the beams diffracted and scattered by the position detection mark is very small as far as the difference in depth is (2m+1)/4 times the wavelength of the detection beam in the photoresist. FIG. 7D is a plan view showing the band-like mark with a difference in depth, and FIG. 7E is a sectional view taken along the line 7E—7E in FIG. 7D when viewed from arrows. Also in this example, the recessed portion of the mark was tapered in the measurement direction (widthwise direction) at a tilt equal to that in FIG. 7B.

In the apparatuses of the embodiments shown in FIGS. 1A and 2A, the off-axis scheme is employed, but a TTL (Through The Lens) scheme or a TTR (Through The Reticle) scheme may be employed. In the TTL scheme, the detection beam is irradiated on the position detection mark formed on the semiconductor wafer 6 through a projection optical system, and the beam generated by the mark and passing through the projection optical system is photoelectrically detected. In the TTR scheme, the detection beam is irradiated on the position detection mark formed on a reticle, and on the position detection mark formed on the semiconductor wafer 6 through the reticle and a projection optical system, and the beams generated by the two marks are photoelectrically detected.

Figure 3A:
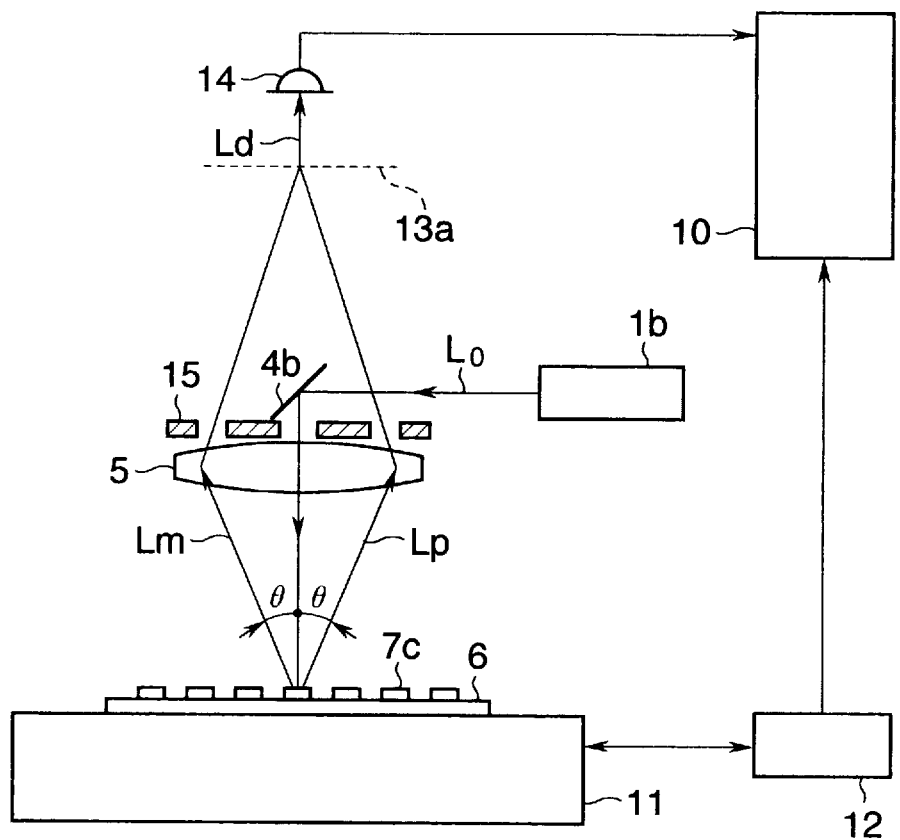
FIG. 3A is a view showing the arrangement of a position detection apparatus of a grating alignment scheme according to the third embodiment.
Figure 3B:
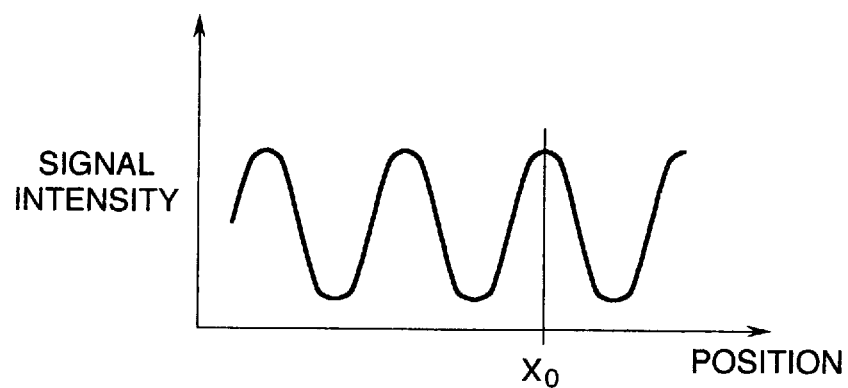
FIG. 3B is a graph for explaining the operation of the apparatus.

Next, the third embodiment of the present invention will be described with reference to FIGS. 3A and 3B. FIG. 3A shows the schematic arrangement of a position detection apparatus of a grating alignment scheme suitable for the present invention. An illumination beam (e.g., an He-Ne laser having a wavelength of 633 nm) $L_0$ emitted from a laser source 1b is irradiated on an almost entire surface of a position detection mark 7c formed on a semiconductor wafer 6 through a mirror 4b, a spatial filter 15, and an objective lens 5. The position detection mark 7c used in this embodiment has the same arrangement as that of the position detection mark 7a used in the first embodiment (FIGS. 6A and 6B).

The beam diffracted by the position detection mark 7c is condensed through the objective lens 5, and only ±first-order diffracted light components Lp and Lm (diffraction angle sinθ=wavelength of detection beam/pitch P of position detection mark) are selected through the spatial filter 15. The ±first-order diffracted light components Lp and Lm form the image of the position detection mark 7c on a reference grating 13a. The reference grating 13a is an amplitude grating, and its pitch is set to be equal to the pitch P of the position detection mark 7c in consideration of the imaging magnification of the objective lens 5. A beam Ld transmitted through the reference grating 13a is incident on a photoelectric detector 14, and the photoelectric detector 14 outputs an electrical signal corresponding to the amount of the beam Ld to a main control system 10.

The main control system 10 drives a wafer stage 11 with a driving system (not shown) to relatively scan the detection beam and the position detection mark 7c in the measurement direction (pitch direction). The main control system 10 then detects the position (position on the coordinate system defined by an interferometer 12) of the position detection mark 7c based on the stage position obtained by the interferometer 12 and a change in the amount of the beam Ld passing through the reference grating 13a (a change in the intensity of the electrical signal output from the photoelectric detector 14). The electrical signal output from the photoelectric detector 14 sinusoidally changes with respect to the position of the wafer stage 11, as shown in FIG. 3B. The position corresponding the maximum value of the electrical signal is the detected position of the position detection mark 7c.

Figure 11A:
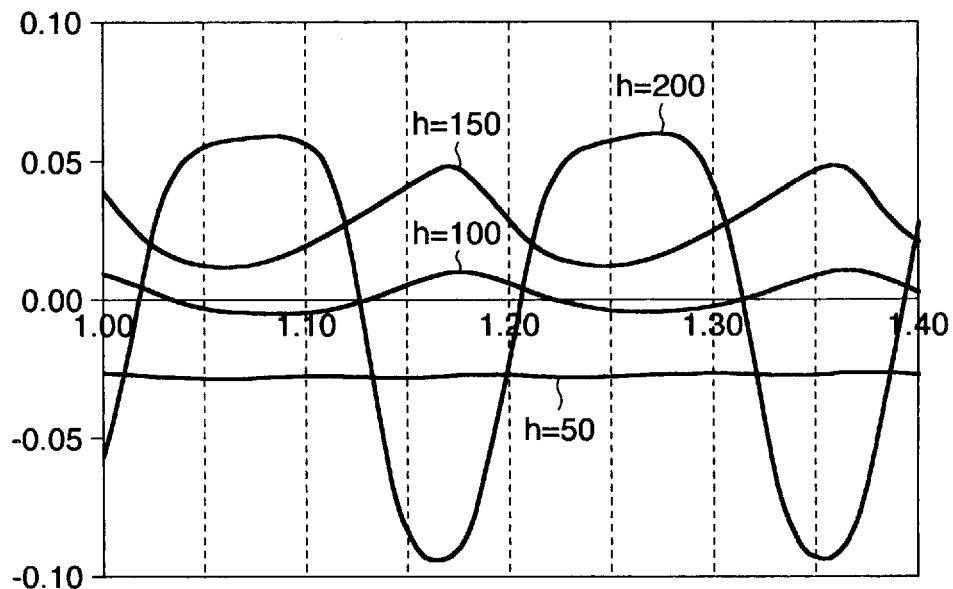
FIGS. 11A and 11B are graphs, respectively, showing the simulation results of the relationship between the difference in depth of a position detection mark and the position detection precision in the third embodiment.
Figure 11B:
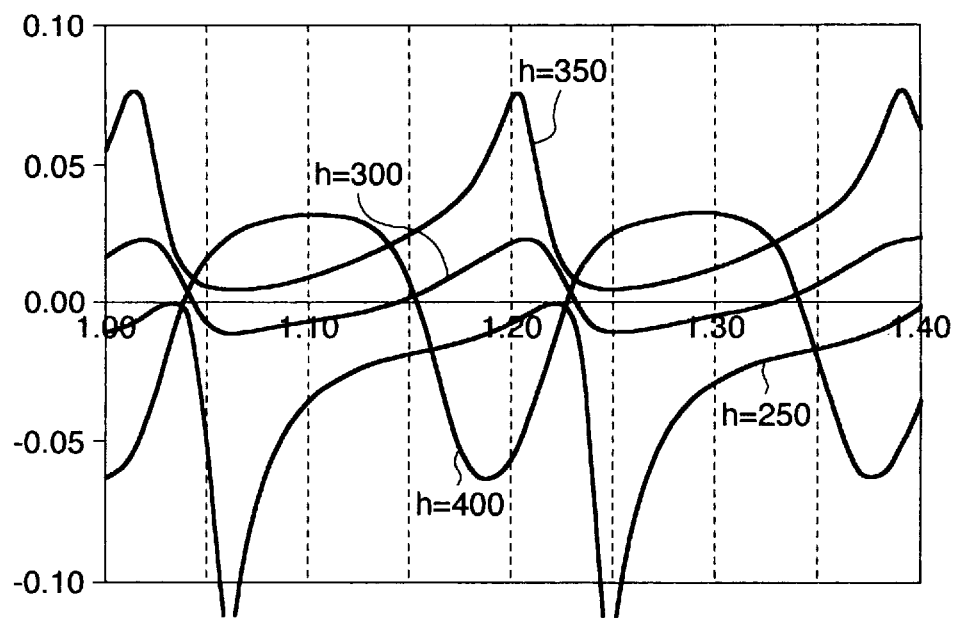

FIGS. 11A and 11B show the simulation results of the relationship between a difference h in depth of the position detection mark 7c and the position detection precision in an apparatus as shown in FIG. 3A. The shape of the position detection mark 7c used in the simulation is such that each of recessed and projecting portions had a width of 4 μm in the pitch direction, the pitch P was 8 μm, and each recessed portion was tapered at a tilt t=0.1% in the measurement direction (pitch direction). The detection laser beam had a wavelength of 633 nm (He-Ne laser). Remaining conditions were the same as in the first embodiment.

In FIGS. 11A and 11B, the resist thickness d [μm] is plotted along the abscissa, and a position detection error [μm] is plotted along the ordinate. FIG. 11A shows the simulation result with the differences h in depth of 50, 100, 150, and 200 nm, while FIG. 11B shows the simulation result with the differences h in depth of 250, 300, 350, and 400 nm. In FIGS. 11A and 11B, as in the first and second embodiments (FIGS. 9A, 9B, 10A, and 10B), it was found that the detection error was very small with the mark differences h in depth of 100 nm and 300 nm.

In the third embodiment as in the second embodiment, a wavelength λ of a detection beam $L_0$ near the position detection mark 7c (in the photoresist) was 381 nm. Therefore, the differences in depth of 100 nm and 300 nm almost correspond to ¼ and ¾ the wavelength λ, respectively. More specifically, also in the position detection apparatus of the grating alignment scheme as in this embodiment, the detection error is very small in a position detection mark with a difference in depth corresponding to almost ¼ times or ¾ times the wavelength λ of the detection beam. Further, similar to the second embodiment, the detection error is very small in a position detection mark with differences in depth corresponding to ⁵⁄₄ times, ⁷⁄₄ times, . . . , i.e., (2m+1)/4 times (m is an integer of 0 or more) the wavelength λ of the detection beam.

From this result, also in this embodiment, the position detection mark 7c consisting of recessed or projecting portions each having the difference h in depth (2m+1)/4 times the wavelength λ of the detection beam is formed on the surface of, e.g., the semiconductor wafer 6. The detection beam is irradiated on the position detection mark 7c through the photoresist. The main control system 10 receives an electrical signal output from the photoelectric detector 14 with a slight movement of the wafer stage 11, and a position signal output from the interferometer 12 to detect the position of the position detection mark 7c.

Figure 4:
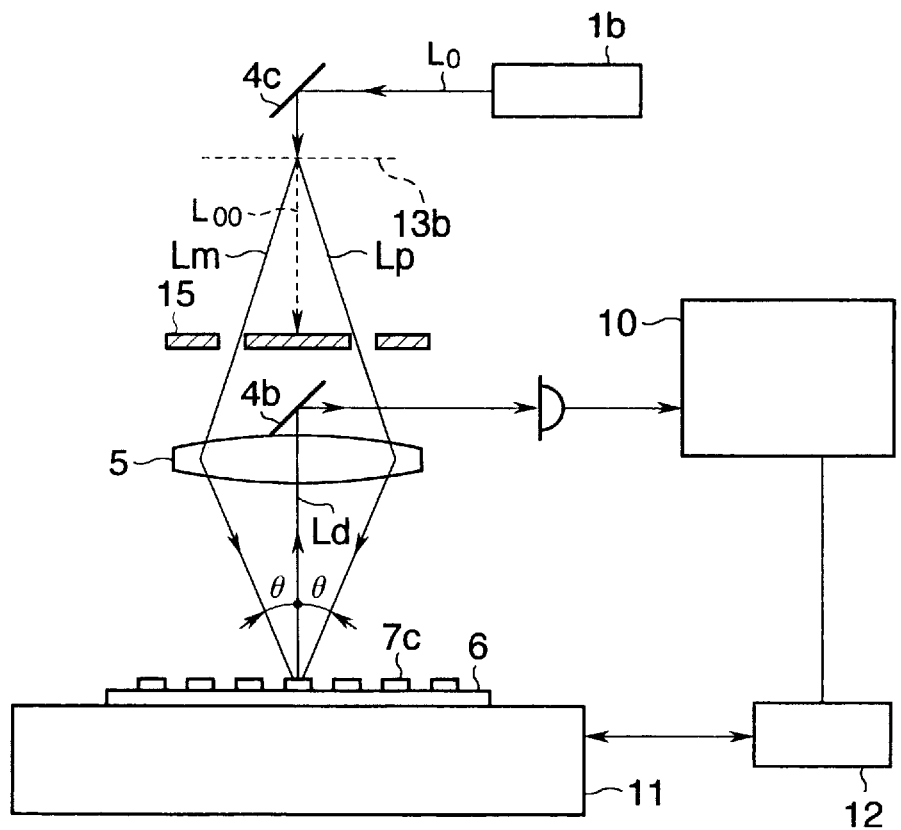
FIG. 4 is a view showing the arrangement of a position detection apparatus of the grating alignment scheme.
Figure 5:
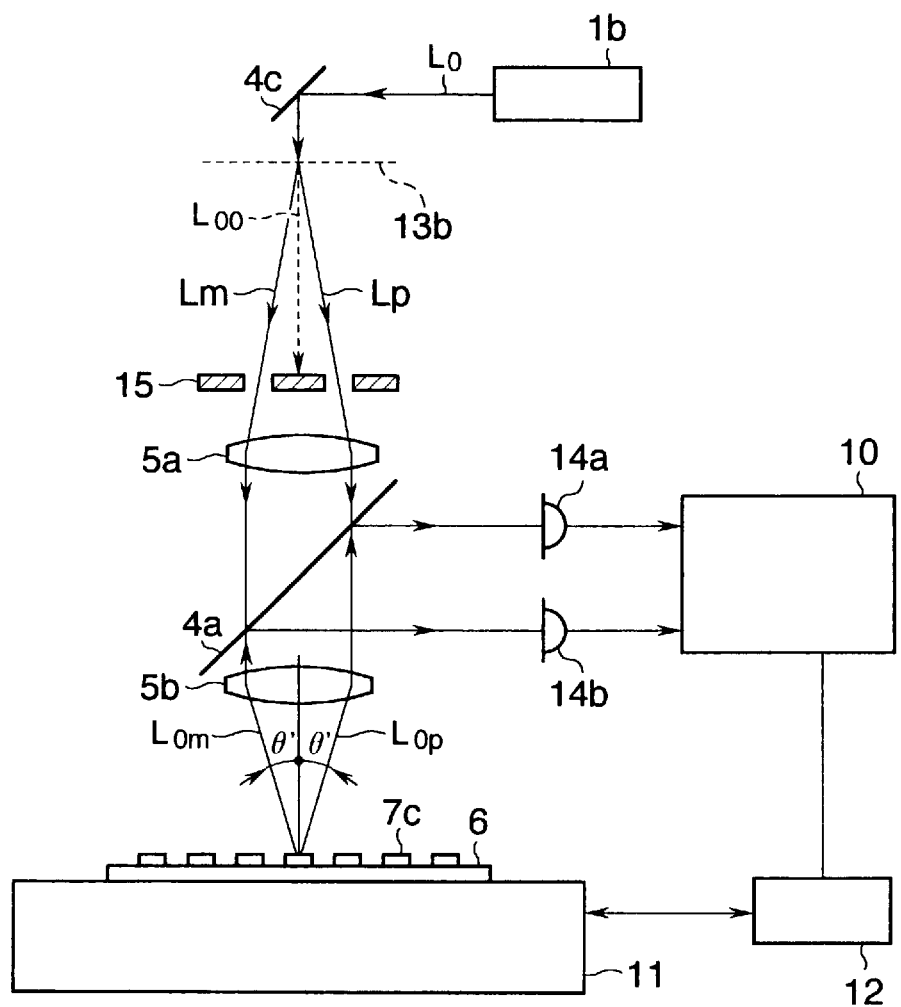
FIG. 5 is a view showing the arrangement of a position detection apparatus of the grating alignment scheme.

As a position detection apparatus of the grating alignment scheme, apparatuses having arrangements respectively shown in FIGS. 4 and 5 are available in addition to the arrangement shown in FIG. 3A.

In the apparatus shown in FIG. 4, the illumination beam $L_0$ emitted from the laser source 1b is irradiated on a reference grating 13b for forming the image of the position detection mark 7c. Of the components generated by the reference grating 13b, only ±first-order diffracted light components Lp and Lm are selected through the spatial filter 15, and, e.g., a 0th-order diffracted light component $L_{00}$ is cut by the spatial filter 15. The ±first-order diffracted light components Lp and Lm are condensed through the objective lens 5 to form the image of the reference grating 13b on the position detection mark 7c. At this time, an incident angle θ of the ±first-order diffracted light components Lp and Lm with respect to the position detection mark 7c is represented by sinθ=(wavelength of illumination beam $L_0$)/(pitch P). Therefore, first-order diffracted light components Ld generated by irradiating the ±first-order diffracted light components Lp and Lm on the position detection mark 7c overlap each other vertically (along the optical axis of the objective lens 5). The photoelectric detector 14 receives the two first-order diffracted light components Ld through the objective lens 5 and the mirror 4b, and outputs an electric signal corresponding to the amount (intensity) of the first-order diffracted light components Ld to the main control system 10.

The electric signal input to the main control system 10 is identical to the electric signal in the third embodiment (FIG. 3A). The position of the position detection mark 7c can be detected by subsequent processes in the same as those in the third embodiment.

The apparatus shown in FIG. 5 has almost the same arrangement shown in FIG. 4 except that the pitch (P) of the reference grating 13b is twice (2P) the pitch in the apparatus shown in FIG. 4. As a result, an incident angle θ' of the ±first-order diffracted light components Lp and Lm passing through the reference grating 13b with respect to the position detection mark 7c is represented by sinθ'=(wavelength of detection beam $L_0$)/2P. Two first-order diffracted light components generated by the position detection mark 7c therefore overlap the 0th-order diffracted light components (regularly reflected light components) of the remaining light components, respectively. That is, a beam $L_{op}$ obtained by overlapping the first-order diffracted light components of the +first light component Lp and the 0th-order light component of the −first light component Lm, and a beam $L_{om}$ obtained by overlapping the first-order diffracted light component of the −first light component Lm and the 0th-order light component of the +first light component are symmetrically generated with respect to the optical axis of the objective lens 5. The two beams $L_{op}$ and $L_{om}$ reversely pass through the optical paths of the +first light components Lp and Lm, respectively. Photoelectric detectors 14a and 14b respectively receive the beams $L_{op}$ and $L_{om}$ through an objective lens 5b and a half mirror 4a, and output electrical signals corresponding to the amounts (intensities) of the beams $L_{op}$ and $L_{om}$ to the main control system 10. The two electrical signals are slightly different from the electrical signal in the third embodiment. However, by calculating the average position of positions corresponding to the maximum intensities of the two electrical signals, completely the same detection result can be obtained as the detected position calculated from the electric signal in the third embodiment.

In the apparatuses having the arrangements respectively shown in FIGS. 4 and 5, e.g., the reference grating 13b may be scanned instead of scanning the wafer stage 11. In addition, a slight frequency difference may be generated between the ±first-order diffracted light components Lp and Lm by using an acousto-optic modulator (AOM) or the like to scan an image (interference fringes) formed on the position detection mark 7c. Further, two beams may be generated by using a beam splitter, a prism, or the like instead of using the reference grating 13b.

Also in an apparatuses of the grating alignment scheme having an arrangement as shown in FIGS. 4 or 5, the relationship between the mark difference in depth and the position detection error was completely the same as that in FIGS. 11A and 11B. That is, also in the grating alignment scheme as shown in FIGS. 4 and 5, the detection error is very small as far as the difference h in depth of the position detection mark is (2m+1)/4 times the wavelength λ of the detection beam in the photoresist.

Although the above position detection apparatus (FIGS. 3A, 4, and 5) of the grating alignment scheme is of the off-axis scheme, it can be used as the above TTR scheme by forming, e.g., the reference grating (13a and 13b) on a reticle, and by using the objective lens 5 as a projection optical system. Assume that a detection beam having a wavelength band different from an exposure wavelength is used in the TTR scheme. In this case, as disclosed in, e.g., Japanese Patent Laid-Open Application No. 5-160001, a deflection element (e.g., a diffraction grating or a Fresnel zone plate) for correcting a chromatic aberration (at least one of an on-axis chromatic aberration and a magnification chromatic aberration) at the wavelength of the detection beam is arranged on the pupil surface of the projection optical system or on a surface near the pupil surface. Two beams generated by a reference grating on a reticle or a position detection mark on a semiconductor wafer are formed (crossed) into an image on the other mark (the position detection mark or the reference grating).

Moreover, the apparatuses shown in FIGS. 3A, 4, and 5 may be used as the TTL scheme. In the TTL scheme, the detection beam is irradiated on the position detection mark formed on the semiconductor wafer through the projection optical system to detect only the position detection mark. For this reason, no problem is posed even if the wavelength of the detection beam is different from an exposure wavelength to generate a chromatic aberration. If the chromatic aberration is corrected (its amount is reduced) by using the above deflection element in the TTL scheme, an increase in the size of the position detection optical system to correct the the chromatic aberration can be advantageously avoided.

Note that the grating alignment scheme shown in FIGS. 3A, 4, and 5 may be a heterodyning for generating a frequency difference between two beams to be irradiated on the position detection mark 7c, or a homodyning scheme for generating no frequency difference between two beams.

In all the above embodiments, the difference h in depth of the position detection mark is set to be $(2m+1)/4$ times the wavelength (accurately, a wavelength in a medium such as a photoresist, covering the position detection mark) $\lambda$ of the detection beam. This value is optimum, and the difference h in depth is not necessarily set to be strictly this optimum value. If the difference h in depth falls within the range of about ±0.05 times the wavelength (the above wavelength in the medium) $\lambda$ of the detection beam using this optimum value as a center, i.e., within $(2m+1)\lambda/4 \pm 0.05\lambda$, a sufficiently high position detection precision can be obtained.

In the case of a beam (quasimonochromatic beam) of a detection beam having a certain wide wavelength, the weighted mean of a wavelength may be employed as the center wavelength in consideration of a spectral distribution. Further, the position detection mark is formed on the surface of a substrate such as a semiconductor wafer. Alternatively, when a film on which the pattern of a microdevice such as a semiconductor element is to be formed is applied to the substrate, the position detection mark may be formed on this film together with the pattern.

In the above embodiments, the position detection mark formed on the substrate is covered with the photoresist. In some cases, in the manufacturing step (exposure step) of, e.g., semiconductor elements or color CCDs (or liquid crystal elements), another thin film (layer) may be interposed between the photoresist, and the surface (of the substrate or the surface of a thin film formed thereon) on which the position detection mark is formed. In other words, a layer on which the pattern image of a mask is to be formed by a projection/exposure apparatus may not be a position detection mark formation surface. At this time, a detection beam is irradiated from the projection/exposure apparatus on the position detection mark through the photoresist and the different thin film. In this case, the above condition of the difference in depth, i.e., the value $\lambda$ in $(2m+1)\lambda/4 \pm 0.05\lambda$ represents the wavelength of the detection beam in another thin film. Additionally, when the position detection mark is exposed in outer air or vacuum, in a gas or liquid such as nitrogen, the step size may be determined in accordance with the wavelength of the detection beam in this atmosphere. That is, the difference h in depth is set to fall within the range of $(2m+1)\lambda/4 \pm 0.05\lambda$ by using the wavelength or center wavelength $\lambda$ of the detection beam in the thin film covering the position detection mark or in the atmosphere (medium).

Note that a polysilicon filter, a color filter, or the like can be used as another thin film. In the manufacturing process of color CCDs or color liquid crystal displays, a filter with a predetermined color (red, blue, or the like) is formed on a substrate, and the pattern image of a mask is exposed on a photoresist to be applied to the filter to form the pattern image on the color filter. Alternatively, only a photoresist (color resist) with a predetermined color is formed on a substrate, and the pattern image of a mask is formed on this color resist.

In general, in the manufacturing process of microdevices such as semiconductor devices, formation of a position detection mark (alignment mark) is performed simultaneously in formation (film formation, etching) of a circuit pattern. When the characteristics of the circuit pattern are optimized, the difference in depth of the position detection mark may fall outside the conditions of the present invention. To avoid this situation, a position detection mark having an optimum difference in depth size is formed on a substrate before all the device manufacturing steps (in other words, prior to a photolithography step of forming all a plurality of mask patterns required for forming microdevices, on the substrate). In all subsequent steps, the position of this mark is detected, and the patterns overlap this mask and is formed.

As has been described above, according to the present invention, the position of an asymmetric position detection mark can be detected with a high precision. Further, since the position of a position detection mark formed on a substrate can be detected with a high precision in a photolithography step of manufacturing microdevices such as semiconductor devices, and particularly in an exposure step, the alignment (overlapping) precision between a mask and the substrate is increased to obtain high-precision microdevices.

What is claimed is:

1. A position detection method for detecting a position of a substrate in order to align said substrate or a pattern formed on said substrate, comprising the steps of:

forming a position detection mark having a recessed or projecting portion on said substrate with a difference h in depth that is set to satisfy $$(2m+1)\lambda/4 - 0.05\lambda \leq h \leq (2m+1)\lambda/4 + 0.05\lambda$$

in processing said substrate, where $\lambda$ is a wavelength or center wavelength of a monochromatic or quasimonochromatic detection beam in a medium covering said position detection mark, and m is an integer not less than 0;

irradiating said detection beam on said recessed or projecting portion; and detecting a position or positional shift of said position detection mark with an image pickup device which detects an image of said position detection mark.

2. A method according to claim 1, wherein said position detection mark is formed on a surface of said substrate or a film on said substrate.

3. A method according to claim 1, wherein said substrate is a semiconductor wafer, and said position detection mark is directly formed on a surface of said semiconductor wafer in the most initial step of processing said semiconductor wafer.

4. A position detection method for detecting a position of a substrate in order to align said substrate or a pattern formed on said substrate, comprising the steps of:

forming a position detection mark having a recessed or projecting portion on said substrate with a difference h in depth that is set to satisfy $$(2m+1)\lambda'/4-0.05\lambda' \leq nh \leq (2m+1)\lambda'/4+0.05\lambda'$$

in processing said substrate, where $\lambda'$ is a wavelength or center wavelength of a monochromatic or quasimonochromatic detection beam in a vacuum, n is a refractive index of a medium covering said position detection mark, and m is an integer not less than 0;

irradiating said detection beam on said recessed or projecting portion; and detecting a position or positional shift of said position detection mark with an image pickup device which detects an image of said position detection mark.

5. A method according to claim 4, wherein said position detection mark is formed on a surface of said substrate or a film on said substrate.

6. A method according to claim 4, wherein said substrate is a semiconductor wafer, and said position detection mark is directly formed on a surface of said semiconductor wafer in the most initial step of processing said semiconductor wafer.

* * * * *